(12) United States Patent
Echizenya et al.

(10) Patent No.: US 8,389,849 B2
(45) Date of Patent: Mar. 5, 2013

(54) SOLAR BATTERY PANEL

(75) Inventors: Daisuke Echizenya, Tokyo (JP);
Masashi Nakamura, Tokyo (JP);
Junichi Yasuda, Tokyo (JP); Teruto Miura, Tokyo (JP); Yoshikazu Ikuta, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 429 days.

(21) Appl. No.: 12/672,284

(22) PCT Filed: Jun. 2, 2008

(86) PCT No.: PCT/JP2008/060144
§ 371 (c)(1),
(2), (4) Date: Feb. 5, 2010

(87) PCT Pub. No.: WO2009/019929
PCT Pub. Date: Feb. 12, 2009

(65) Prior Publication Data
US 2011/0146745 A1      Jun. 23, 2011

(30) Foreign Application Priority Data
Aug. 9, 2007   (JP) .................... 2007-207380

(51) Int. Cl.
*H01L 31/0224* (2006.01)
(52) U.S. Cl. .................... 136/244; 136/243; 136/256
(58) Field of Classification Search .......... 136/243–265; 438/57, 98, 66, 67
See application file for complete search history.

(56) References Cited

U.S. PATENT DOCUMENTS

| | | | |
|---|---|---|---|
| 6,388,187 B1 | 5/2002 | Takeyama et al. | |
| 2001/0029975 A1 | 10/2001 | Takeyama et al. | |
| 2001/0029976 A1 | 10/2001 | Takeyama et al. | |
| 2004/0200522 A1 | 10/2004 | Fukawa et al. | |
| 2009/0214796 A1* | 8/2009 | Okaniwa et al. | 427/444 |
| 2009/0277491 A1 | 11/2009 | Nakamura et al. | |

FOREIGN PATENT DOCUMENTS

| | | |
|---|---|---|
| JP | 11 214733 | 8/1999 |
| JP | 11 243224 | 9/1999 |
| JP | 11 251613 | 9/1999 |
| JP | 11 312820 | 11/1999 |
| JP | 2001 274427 | 10/2001 |
| JP | 2002 111024 | 4/2002 |
| JP | 2002-111024 * | 4/2002 |

(Continued)

OTHER PUBLICATIONS

U.S. Appl. No. 11/933,035, filed Dec. 19, 2007, Echizenya, et al.

*Primary Examiner* — Jennifer Michener
*Assistant Examiner* — Jayne Mershon
(74) *Attorney, Agent, or Firm* — Oblon, Spivak, McClelland, Maier & Neustadt, L.L.P.

(57) ABSTRACT

A solar battery panel wherein cracking of solar battery cells can be reduced without reducing the power generating capacity per unit area. The solar battery panel consists of a plurality of solar battery cells (1) connected in series by connecting surface electrode tabs (104) to rear electrode tabs (105). In the solar battery panel, a tab-to-tab connecting portion (107) and a tab-to-cell connecting portion (106) are arranged via a gap (108) in the solar battery cell arrangement direction (162) without these portions overlapping each other. One end portion (107*a*) of the tab-to-tab connecting portion (107) exists within a region of a non-light receiving surface (3).

5 Claims, 15 Drawing Sheets

FOREIGN PATENT DOCUMENTS

| | | |
|---|---|---|
| JP | 2004 179260 | 6/2004 |
| JP | 2004 247402 | 9/2004 |
| JP | 2004 253475 | 9/2004 |
| JP | 2004 281797 | 10/2004 |
| JP | 2005 129773 | 5/2005 |
| JP | 2005 252062 | 9/2005 |
| JP | 2005 317671 | 11/2005 |
| WO | WO 2006/132351 | * 12/2006 |
| WO | 2007 043428 | 4/2007 |

* cited by examiner

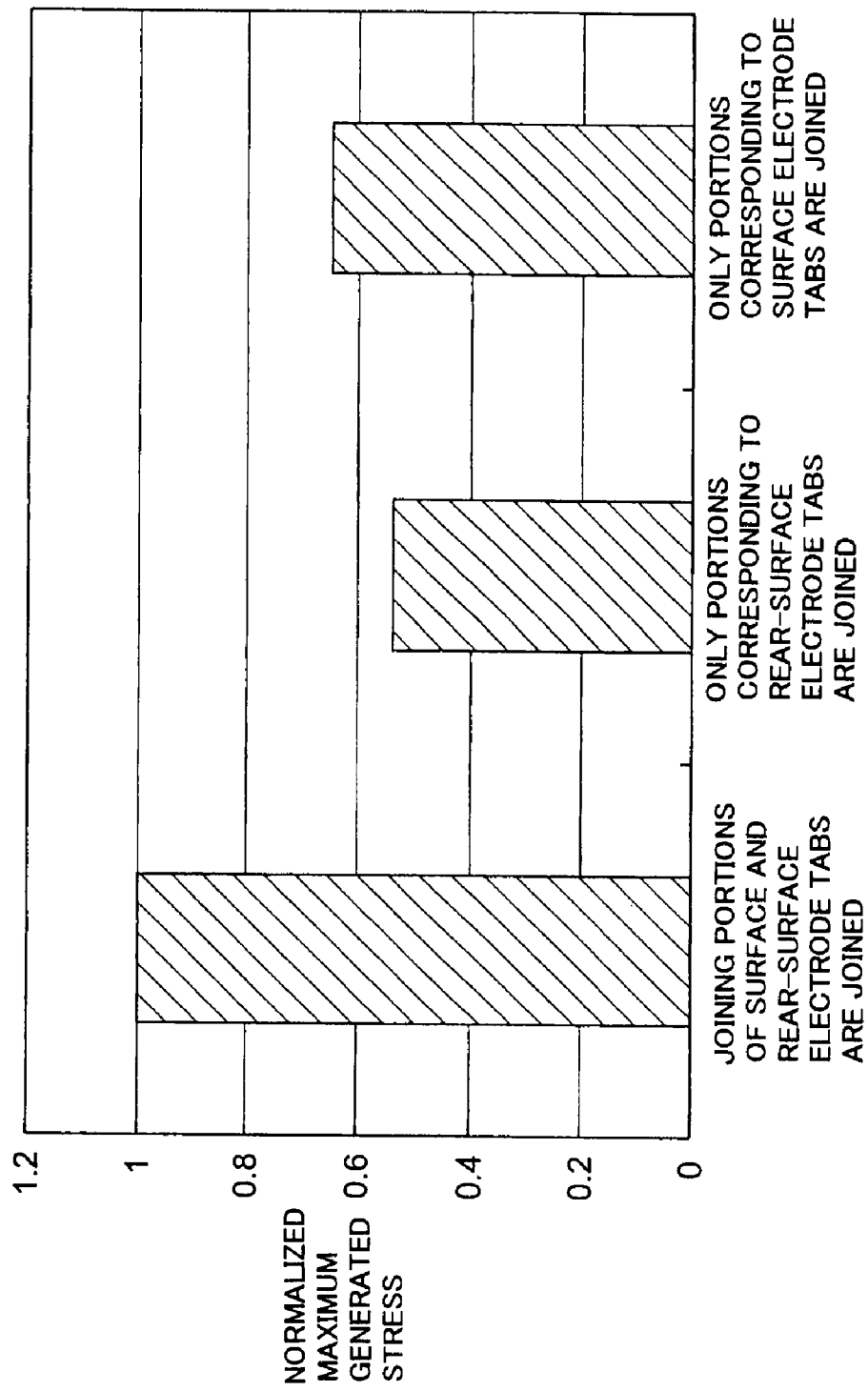

SOLAR BATTERY PANEL

TECHNICAL FIELD

The present invention relates to a solar battery panel having a structure in which a plurality of solar cells are connected to one after another by electrode tabs.

BACKGROUND ART

A plurality of solar cells, each manufactured by using a thin crystal substrate such as silicon or the like, are joined to a reinforcing plate such as a hardened glass, by using an ethylene-vinyl acetate copolymer (EVA) or the like so that a solar battery panel is manufactured.

In the solar battery panel, in general, the respective solar cells are series-connected so as to make its output voltage greater. That is, in the conventional solar battery panel, by connecting each surface electrode tab joined to a light-receiving face of the solar cell and each rear-surface electrode tab jointed to a non-light-receiving face of the solar cell, the respective solar cells are connected in series with one another (for example, Patent Citation 1).

Moreover, in the structure in which the respective solar cells are series-connected, an arrangement is proposed in which a notch portion for preventing joined solder from sticking out is formed on the rear-surface electrode (for example, Patent Citation 4).

Another arrangement has been proposed in which the light-receiving face of the solar cell and the non-light-receiving face thereof are connected to each other by using a single electrode tab. However, by using an arrangement in which two kinds of tabs, that is, the surface electrode tab and the rear-surface electrode tab, are used, it is possible to improve the power generating efficiency and also to reduce the thermal deformation due to the electrode tab, by making the respective shapes of the tabs different from each other (see Patent Citation 1).

In the structure having the surface electrode tab and the rear-surface electrode tab, however, upon connecting the surface electrode tab and the rear-surface electrode tab, a load tends to be exerted on the solar cell to sometimes cause a crack in the solar cell. In order to solve this problem, an arrangement is proposed in which, with the joined portion of the surface electrode tab and the rear-surface electrode tab being placed outside the solar cell, the solar cells are connected to one after another so that, upon connecting the electrode tabs, a pressing load is prevented from exerting on the solar cells (for example, see Patent Citations 2 and 3).

Patent Citation 1: JP-A No. 2004-281797 (FIG. 1)
Patent Citation 2: JP-A No. 2004-247402 (FIG. 1)
Patent Citation 3: JP-A No. 2005-129773 (FIG. 1)
Patent Citation 4: JP-A No. 2002-111024

DISCLOSURE OF INVENTION

Technical Problem

However, in the above-mentioned structure in which, with the joined portion of the electrode tabs being placed outside the solar cell, the solar cells are connected to one after another, since the joined portion is placed outside the solar cell, the gap between the adjacent solar cells tends to be widened. Consequently, the integration degree of the solar cells in the solar battery panel is lowered, resulting in a problem that the amount of power generation per unit area of the solar battery panel is reduced.

In order to solve the above-mentioned problems, the present invention has been devised, and an object thereof is to provide a solar battery panel that can reduce cracking in the solar cells, without causing a reduction in the amount of power generation per unit area.

Technical Solution

In order to achieve the above-mentioned object, the present invention has the following arrangements.

Specifically, a first aspect of the present invention provides a solar battery panel including: solar cells; a surface electrode tab configured to be connected to a light-receiving face of each of the solar cells; and a rear-surface electrode tab configured to be connected to a non-light-receiving face of each of the solar cells, the surface electrode tab being connected to the rear-surface electrode tab, so that a plurality of the solar cells are series-connected to one after another, wherein, a tab-to-tab joined portion connecting the surface electrode tab to the rear-surface electrode tab is disposed in an array direction of the solar cells with a gap and in a manner so as not to be overlapped with respect to a tab-to-cell joined portion between the rear-surface electrode tab and the solar cell in a thickness direction of the solar cells, and one end portion of the tab-to-tab joined portion positioned on the tab-to-cell joined portion side is located within a region of the non-light-receiving face.

The other end portion of the tab-to-tab joined portion opposing to the one end portion in the array direction may also be located within the region of the non-light-receiving face.

The solar battery panel may further include a collector electrode configured to be formed on the non-light-receiving face by using aluminum paste, wherein the surface electrode tab and the rear-surface electrode tab are soldered, and the tab-to-tab joined portion is disposed within a region of the collector electrode.

The solar battery panel may further include a tab-use electrode configured to be formed on the non-light-receiving face by using silver paste and to be connected to the rear-face electrode tab through the tab-to-cell joined portion; and a non-electrode formation region configured to be formed on the non-light-receiving face with opposing to the gap and configured so that neither the collector electrode nor the tab-use electrode is located thereon.

Supposing that T1 represents a thickness of the surface electrode tab and that T2 represents a thickness of the rear-surface electrode tab, the gap X may be set within a range indicated by the following equation:

$$2 \cdot T1 < X < 5 \cdot (T1 + T2).$$

One solar cell may have a plurality of the tab-to-tab joined portions and tab-to-cell joined portions on the non-light-receiving face thereof, with the tab-to-tab joined portions and the tab-to-cell joined portions being alternately disposed in the array direction of the solar cells.

Advantageous Effects

In accordance with the solar battery panel of the present invention, it is possible to obtain a solar battery panel that can reduce cracking in the solar cells, without causing a reduction in the amount of power generation per unit area of the solar battery panel.

BRIEF DESCRIPTION OF DRAWINGS

FIG. 8 is a graph that shows the analysis results obtained from the analysis model shown in FIG. 7.

EXPLANATION OF REFERENCE

Figure 1A:
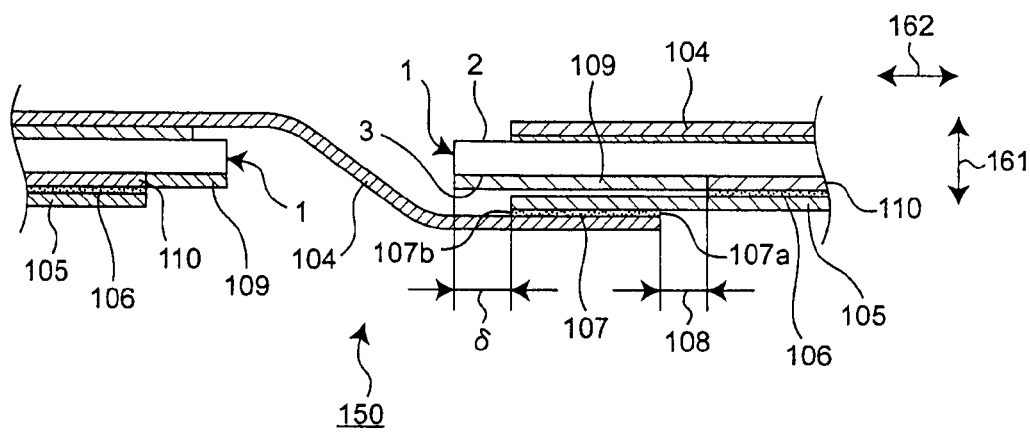
FIG. 1A is a side view that shows a connected state of solar cells included in a solar battery panel in accordance with a first embodiment of the present invention.

1 Solar cell, 2 Light-receiving face,
3 Non-light-receiving face,
104 Surface electrode tab, 105 Rear-surface electrode tab,
106 Tab-to-cell joined portion,
107 Cell-to-cell joined portion, 107a One end portion,
107b The other end portion, 108 Gap,
109 Collector electrode, 110 Tab-use electrode,
122 Non-electrode formation region,
150, 153, 154 Solar battery panel, 162 Array direction.

BEST MODE FOR CARRYING OUT THE INVENTION

Referring to attached drawings, the following description will discuss preferred embodiments of a solar battery panel in accordance with the present invention. In the respective drawings, the same or similar components are indicated by the same reference numerals.

In order to improve understanding of a structure of the solar battery panel in the embodiments, first, referring to FIGS. 11A to 11E, the following description will discuss a structure of a conventional solar battery panel 50 and a series connection of solar cells 1 to be used for the solar battery panel 50.

Figure 11A:
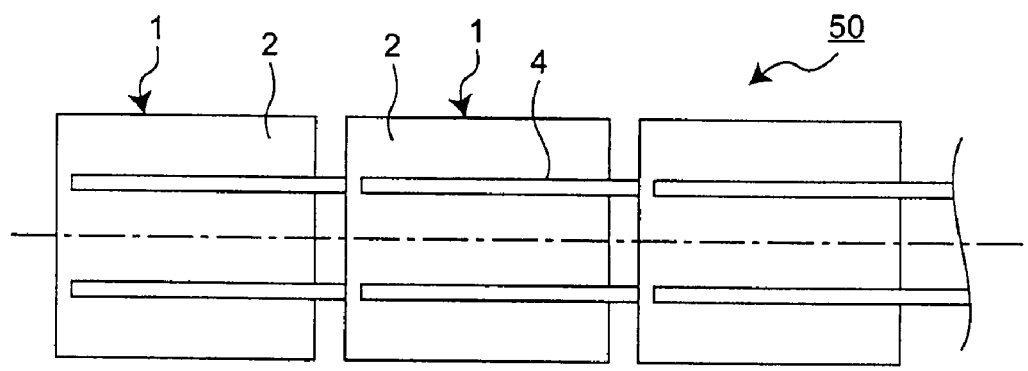
FIG. 11A is a plan view that shows a connected state of solar cells to be used for a conventional solar battery panel.
Figure 11B:
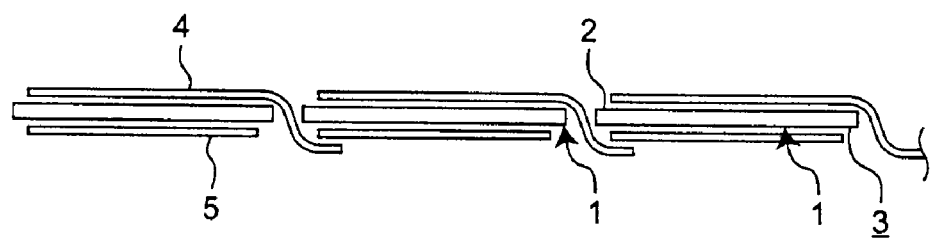
FIG. 11B is a side view of the solar cells in the connected state shown in FIG. 11A.
Figure 11C:
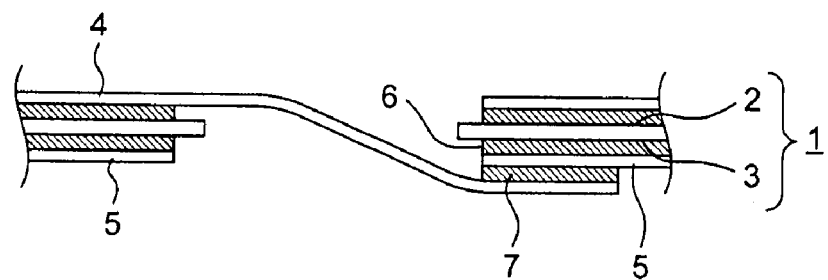
FIG. 11C is an enlarged view that shows the connected state of the solar cells shown in FIG. 11A.
Figure 11D:
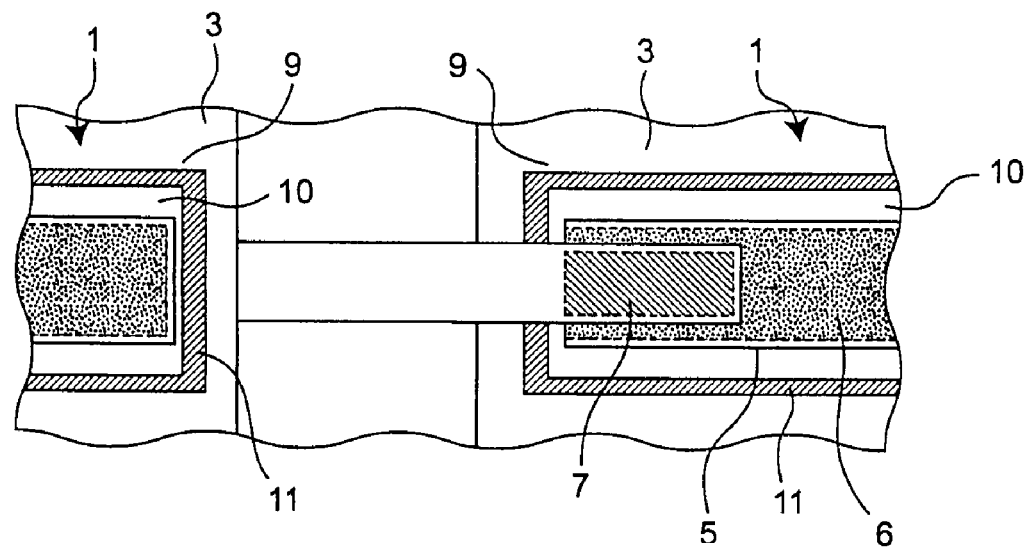
FIG. 11D is an enlarged view that shows a connected state between electrode tabs in the solar cells shown in FIG. 11A.
Figure 11E:
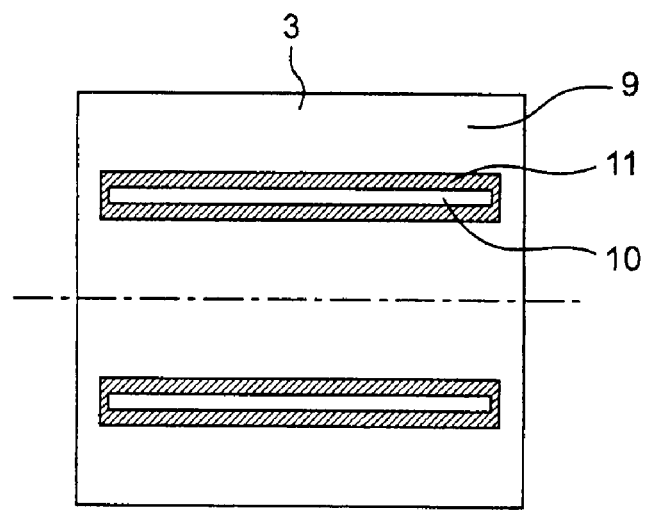
FIG. 11E is a plan view that shows a non-light-receiving face of the solar cell shown in FIG. 11A.

FIG. 11A is a top view of the solar battery panel 50 obtained when solar cells 1 included in the solar battery panel 50 are viewed from the light-receiving face 2 side. In this case, reference numeral 4 represents a surface electrode tab. FIG. 11B is a side view of the solar battery panel 50 shown in FIG. 11A. Reference numeral 3 represents a non-light-receiving face of the solar cell 1, and reference numeral 5 represents a rear-surface electrode tab. FIG. 11C is a side view of the solar battery panel 50 of FIG. 11B in which the gap between the adjacent solar cells 1 is enlarged. In this case, reference numeral 6 represents a joined portion between the light-receiving face 2 and the surface electrode tab 4 of the solar cell 1 and a joined portion between the non-light-receiving face 3 and the rear-surface electrode tab 5 of the solar cell 1, and reference numeral 7 represents a joined portion between the rear-surface electrode tab 5 and the surface electrode tab 4. FIG. 11D is a bottom view of the solar buttery panel 50 obtained when the mutual adjacent solar cells 1 illustrated in an enlarged manner are viewed from the non-light-receiving face 3 side. In this case, reference numeral 9 represents a collector electrode formed on the non-light-receiving face 3 by an aluminum paste, and reference numeral 10 represents an electrode to which the rear-surface electrode tab 5, formed on the non-light-receiving face 3 by silver paste, is soldered, and reference numeral 11 represents an alloy portion formed with the aluminum paste and the silver paste. Additionally, in FIGS. 11B and 11C, the collector electrode 9, the electrode 10 made of the silver pate and the alloy portion 11 are not shown in the drawings. FIG. 11E shows a shape of the non-light-receiving face 3 of the solar cell 1.

In the solar battery panel 50 constructed as described above, by connecting the surface electrode tab 4 connected to the light-receiving face 2 of the solar cell 1 to the rear-surface electrode tab 5 connected to the non-light-receiving face 3, the respective solar cells 1 are connected in series with one another.

As described in the explanation of the prior art, in the conventional solar battery panel, in a process for connecting the surface electrode tab 4 and the rear-surface electrode tab 5, the crack tends to occur in the solar cell 1. With respect to the reason for this phenomenon, examinations were carried out by using a thermal stress analysis with FEM (finite element method), and the results of the analysis are shown below.

Examinations are carried out on the structure of the conventional solar battery panel 50 so as to find out a thermal stress generated in the solar cell 1 due to the existence of the joined portion 7 between the surface electrode tab 4 and the rear-surface electrode tab 5.

Figure 7:
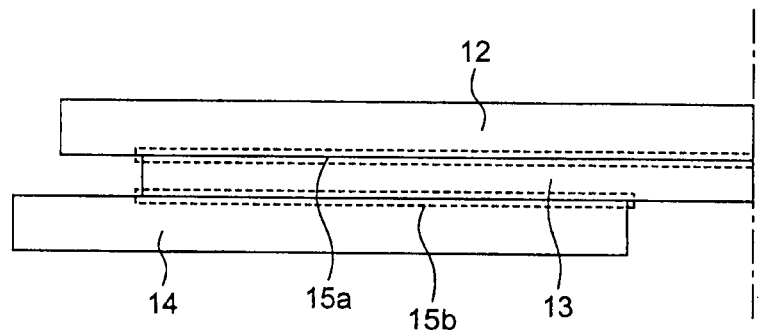
FIG. 7 is a view that shows an analysis model used for examining a stress to be generated in a solar cell due to an electrode tab connection.

FIG. 7 shows an analysis model. The analysis model is a two-dimensional model in which a rear-surface electrode tab model 13 (plate thickness: 0.13 mm) is joined to a solar cell model 12 (plate thickness: 0.2 mm), and a surface electrode tab model 14 (plate thickness: 0.2 mm) is connected onto the rear-surface electrode tab model 13 by a length of 6 mm.

The change of presence and absence of the surface electrode tab model 14 is given to the above analysis model, and a change in stress caused by a difference of thermal expansions between the presence and absence is examined. The examination conditions are as follows. Namely, in the electrode tab models 13 and 14 forming sources of the thermal stress, linear expansion coefficients of them are larger than that of the solar cell 1 (for example, cupper of the electrode tab: 16 $e^{-6}$/K., silicon of solar cell: 4 $e^{-6}$/K.), and a thermal history that varies in a temperature range for use in joining the solar cell and the electrode tab to each other (for example, within 20° C. from 220° C.) is always equally applied to each of the analysis models with the surface electrode tab model 14 and without the surface electrode tab model 14. Moreover, each of the analysis models with and without the surface electrode tab model 14 is subjected to an analyzing process, with its mesh size being set to the same, so that the amounts of generation of thermal stress can be qualitatively compared with each other. Additionally, reference numeral 15a represents a joined model portion between the rear-surface electrode tab model 13 and the solar cell model 12, and reference numeral 15b represents a joined model portion between the surface electrode tab model 14 and the rear-surface electrode tab model 13.

FIG. 8 shows the results of the analysis. Based upon the results of the analysis, it is confirmed that, in a case where the joined portion 7 between the surface electrode tab 4 and the rear-surface electrode tab 5 and the joined portion 6 shown in FIG. 11C are joined to the solar cell 1, that is, where both of the joined model portions 15a and 15b are present, the generated stress is greater than a generated stress in a case where only the rear-surface electrode tab 4 is joined to the solar cell 1, that is, where only the joined model portion 15a is present.

According to the results of the analysis, it is clarified that the reason for the occurrence of a crack in the solar cell 1 in the connecting process between the surface electrode tab 4 and the rear-surface electrode tab 5 lies in that the thermal stress, generated at the joined portion 6 (FIG. 11C) where the rear-surface electrode tab 5 to which the surface electrode tab 4 is connected is connected to the solar cell 1, is greater than thermal stresses occurring on the other portions. Moreover, in general, a plate thickness of the surface electrode tab 4 is larger than a plate thickness of the rear-surface electrode tab 5 (for example, 1.5 to 3 times larger). In accordance with an analysis model in which a plate with a thickness corresponding to that of the surface electrode tab 4 (for example, 0.13 mm) is connected, the generation of stress becomes greater as the plate thickness becomes larger. Therefore, it is clarified that a thermal stress on the light-receiving face 2 side is greater than a thermal stress on the non-light-receiving face 3 side.

Figure 9:
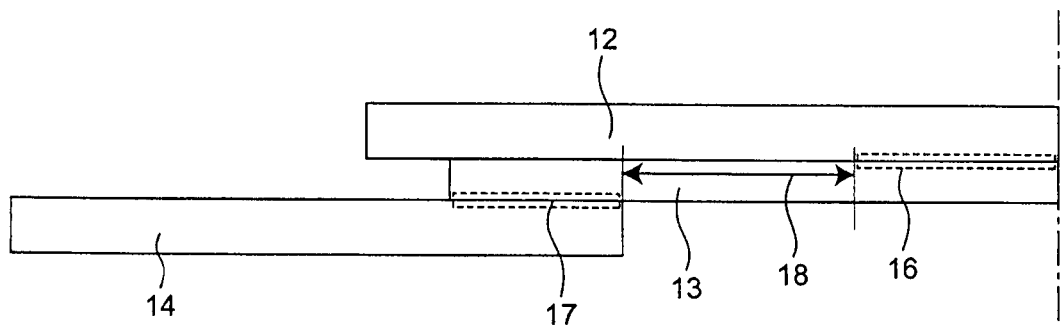
FIG. 9 is a view that shows an analysis model used for examining a stress to be generated in a solar cell in accordance with embodiments of the present invention.

In the next analysis, an analyzing process is carried out in a state where the joined portion 7 and the joined portion 6 are shifted from each other, so that the joined portion 7 between the surface electrode tab 4 and the rear-surface electrode tab 5 is not joined to the solar cell 1, that is, so that the joined portion 7 is not overlapped with the joined portion 6 between the solar cell 1 and the rear-surface electrode tab 5. This analysis model is shown in FIG. 9. This analysis model has a structure in which a gap 18 is provided so as to prevent a joined model portion 17, that is, between the mutual tab models, between the surface electrode tab model 14 and the rear-surface electrode tab model 13, and a joined model portion 16 between the rear-surface electrode tab model 13 and a solar cell model 12 from being overlapped with each other in the thickness direction of the electrode tab. Additionally, in order to obtain a general tendency, the analyzing process is carried out, with a plate thickness of the surface electrode tab model 14, a plate thickness of the rear-surface electrode tab model 13 and the gap 18 being varied.

Figure 10A:
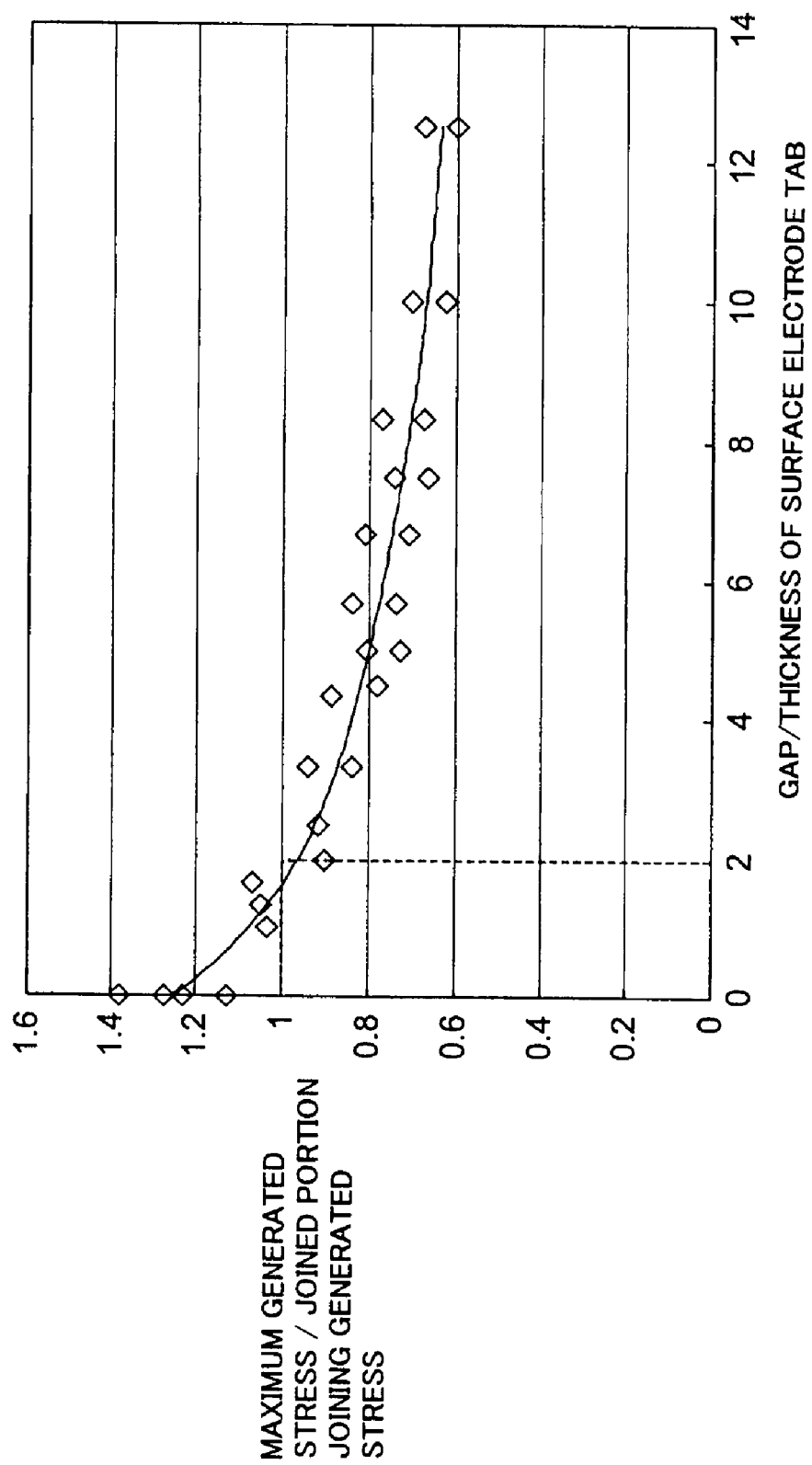
FIG. 10A is a graph that shows the analysis results obtained from the analysis model shown in FIG. 9.
Figure 10B:
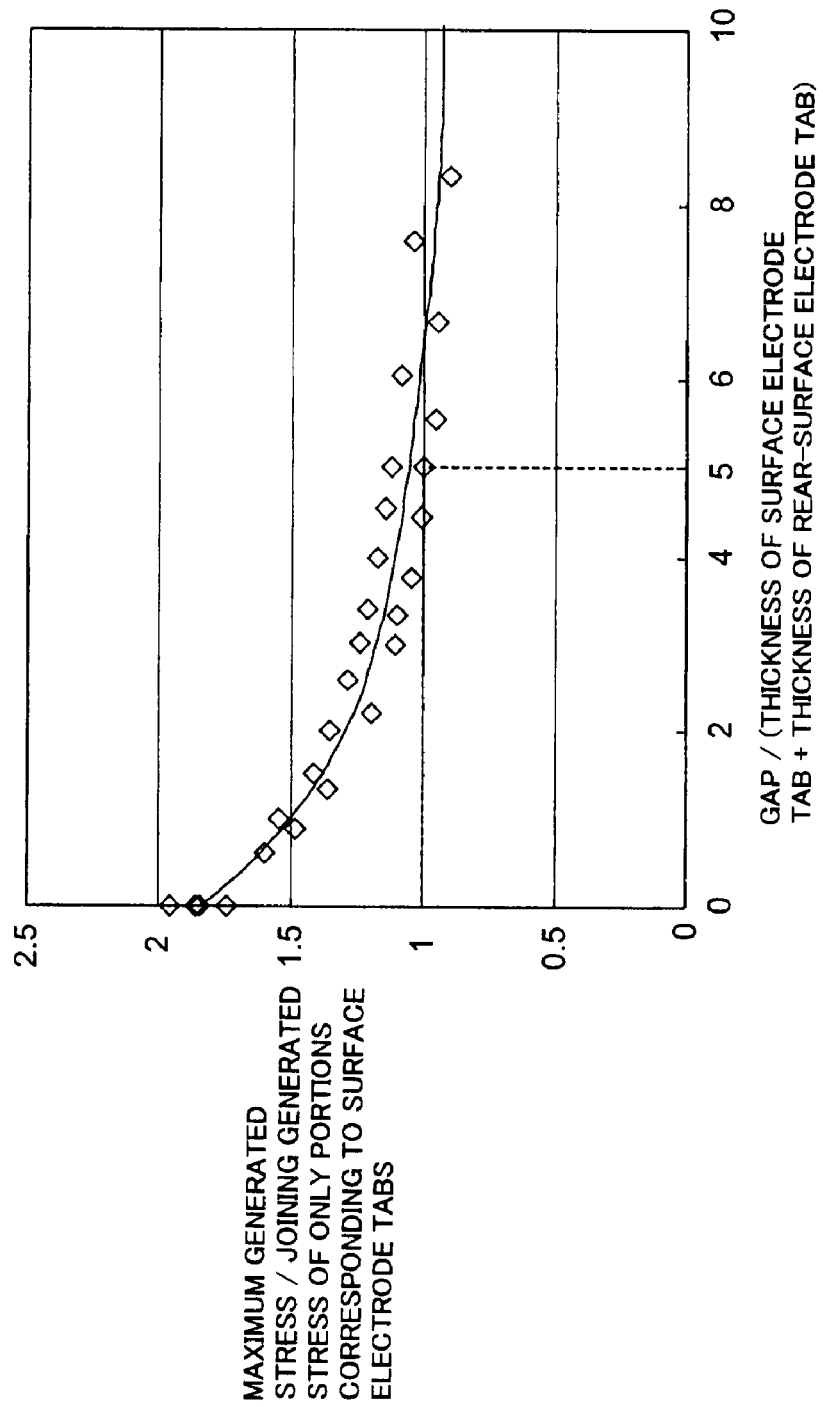
FIG. 10B is a graph that shows the analysis results obtained from the analysis model shown in FIG. 9.

FIGS. 10A and 10B show the relationship between the gap 18 and the maximum stress of the thermal stress generated in the solar cell 1. The maximum stress is normalized by a maximum stress generated in a case where the joined model portion 17 between the surface electrode tab model 14 and the rear-surface electrode tab model 13 is joined to the solar cell model 12, and FIG. 10A shows the results thereof. In accordance with FIG. 10A, when the gap 18 is short, the thermal stress becomes greater oppositely; however, when the joined model portion 17 and the joined model portion 16 are made apart from each other to a certain degree, that is, when the gap 18 exceeds a certain value, the thermal stress is gradually lowered. That is, it is found that when the value of the gap 18 exceeds about two times a thickness of the surface electrode tab 4, the thermal stress is lowered in comparison with that of the conventional structure.

As clearly shown by FIG. 10A, in the case when the gap 18 is shorter than a specified value, the thermal stress is increased in comparison with that of the conventional structure. Consequently, in a state where no sufficient space is prepared around the joined portion 7 between the surface electrode tab 4 and the rear-surface electrode tab 5, even if an attempt is made to form a pattern to be joined by solder so as to prevent solder leakage, for example, as disclosed in JP-A No. 2002-111024, only the adverse effect of increasing the thermal stress is caused oppositely.

As for the relationship between the gap 18 and the maximum stress of the thermal stress generated in the solar cell 1, FIG. 10B shows a result thereof, in which the maximum stress is normalized by a maximum stress generated on the light-receiving face 2 side to which the surface electrode tab 4 is joined. In accordance with FIG. 10B, it is found that, in a case when the gap 18 becomes about 5 times as much as a total of the thickness of the surface electrode tab 4 and the thickness of the rear-surface electrode tab 5, the thermal stress generated on the non-light-receiving face 3 is made equivalent to the thermal stress on the light-receiving face 2 side, even when the gap 18 is further widened, no improvement in strength of the entire solar cell 1 is expected.

Based on the above-mentioned results of analysis, it is found that a thermal stress to be generated in the solar cell 1 can be reduced by forming a predetermined gap between the joined portion 7 connecting the surface electrode tab 4 with the rear-surface electrode tab 5 and the joined portion 6 connecting the rear-surface electrode tab 5 with the solar cell 1.

Therefore, the joined portion 7 connecting the surface electrode tab 4 with the rear-surface electrode tab 5 and the joined portion 6 connecting the rear-surface electrode tab 5 with the solar cell 1 are arranged so as not to be overlapped with each other in the thickness direction of the two tabs, that is, in the thickness direction of the solar cell 1, and the joined portion 7 is not disposed between the adjacent solar cells 1, but at least an end portion of the joined portion 7 on the joined portion 6 side is positioned on the non-light-receiving face 3 of the solar cell 1 in the thickness direction. With this arrangement, it is possible to obtain a solar battery panel, with the occurrence of cracking of the solar cell 1 being reduced, without the necessity of expanding the respective cell gaps. Moreover, since the above-mentioned arrangement further reduces the thermal stress generated in the solar cell 1, it becomes possible to improve the reliability during the actual use of the solar battery panel. Furthermore, it also becomes possible to prolong the service life of the solar battery panel.

Based upon the above-mentioned results of analysis, the embodiments of the solar battery panel in accordance with the present invention are arranged in the following manner.

First Embodiment

FIGS. 1A to 1E show a series connected state of solar cells of a solar battery panel 150 in accordance with a first embodiment of the present invention. In the solar battery panel 150 of the present embodiment also, in the same manner as in the aforementioned solar battery panel 50, the solar battery panel 150 has a structure in which a plurality of solar cells 1 are arranged in an array direction 162, and by connecting a surface electrode tab 104 connected to a light-receiving face 2 of each of the solar cells 1 to a rear-surface electrode tab 105 connected to a non-light-receiving face 3, the respective solar cells 1 are series-connected. In this case, the surface electrode tab 104 corresponds to the aforementioned surface electrode tab 4, and the rear-surface electrode tab 105 corresponds to the aforementioned rear-surface electrode tab 5.

Figure 1B:
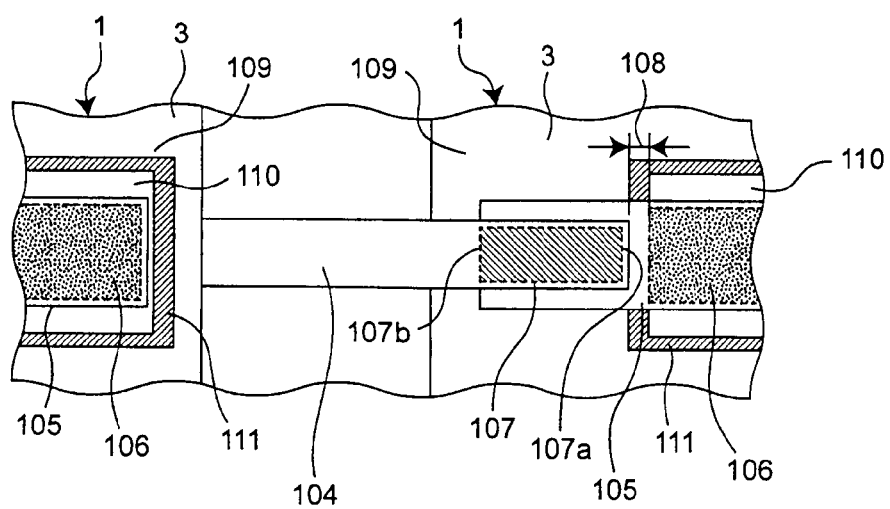
FIG. 1B is a plan view that shows the connected state of solar cells shown in FIG. 1A.

FIG. 1A is a cross-sectional view that shows the above-mentioned series-connected state between the adjacent solar cells 1, and FIG. 1B is a plan view obtained when the gap between the adjacent solar cells 1 is viewed from the non-light-receiving face 3 side.

As shown in FIGS. 1A and 1B, based upon the above-mentioned results of analyses, in the solar battery panel 150 of the present embodiment, a tab-to-tab joined portion 107 which is a connected portion between the surface electrode tab 104 and the rear-surface electrode tab 105 and a tab-to-cell joined portion 106 which is a connected portion between the rear-surface electrode tab 105 and the solar cell 1 are disposed with the gap 108 kept therebetween along the reference numeral 162 that indicates an array direction of the solar cells 1 and corresponds to an extending direction of the two tabs 104 and 105, so as not to be overlapped with each other in a thickness direction 161 of the solar cells 1.

Moreover, as shown in FIGS. 1A and 1B, the solar battery panel 150 has such a structure that, in the tab-to-tab joined portion 107, one end portion 107a of the tab-to-tab joined portion 107, located on the tab-to-cell joined portion 106 side, is positioned within a region of the non-light-receiving face 3 of the solar cell 1. Moreover, in the solar battery panel 150, as shown in FIGS. 1A and 1B, the other end portion 107b of the tab-to-tab joined portion 107 opposing to the one end portion 107a is also positioned within the region of the non-light-receiving face 3.

Figure 1C:
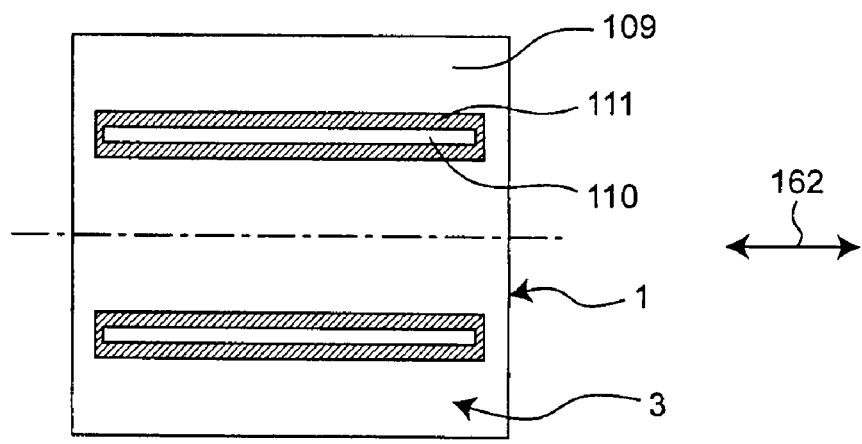
FIG. 1C is a plan view that shows a non-light-receiving face of the solar cell shown in FIG. 1A.

Furthermore, as shown in FIGS. 1A and 1B, the solar cell 1 is made of a silicon crystal plate, and a collector electrode 109 is formed by using an aluminum paste on the non-light-receiving face 3 of the solar cell 1, except for an area where a tab-use electrode indicated by a reference numeral 110 in FIG. 1C is formed. The tab-use electrode 110 is formed by allowing silver paste to be directly made in contact with the non-light-receiving face 3 on the area for the tab-use electrode, and has a thickness that is equivalent thickness of the collector electrode 109.

Moreover, as indicated by reference numeral 111 in FIG. 1C, an alloy portion between the aluminum paste and the silver paste is formed on the border portion between the collector electrode 109 and the tab-use electrode 110. The alloy portion 111 forms a portion used for taking out electricity from the collector electrode 109 to the tab-use electrode 110.

Additionally, the order of the formations of the collector electrode 109 and the tab-use electrode 110 onto the non-light-receiving face 3 is not particularly limited. Moreover, the manufacturing processes of these collector electrode 109 and tab-use electrode 110 by the use of metal pastes are carried out by applying the metal pastes with predetermined shapes, mainly using a mask printing method, to be baked thereon.

The rear-surface electrode tab 105 is connected to the tab-use electrode 110 through the tab-to-cell joined portion 106, and the surface electrode tab 104 is connected to the rear-surface electrode tab 105 through the tab-to-tab joined portion 107.

Moreover, a collector electrode is formed on the light-receiving face 2 by using silver paste, and the surface electrode tab 104 is connected thereon.

As shown in FIG. 10, in the solar battery panel 150 of the present embodiment, two tab-use electrodes 110 are formed on the non-light-receiving face 3 of the solar cell 1 so as to be continuously extended linearly in parallel with each other in the array direction 162.

Moreover, not particularly limited, any material may be used as the material for making connections so as to form the tab-to-cell joined portion 106 and the tab-to-tab joined portion 107 as long as it has a conductive property. In general, a conductive adhesive, a conductive film, soldering, welding and the like have been known as the material. In the first embodiment, the surface electrode tab 104 and the rear-surface electrode tab 105 are prepared as copper wires coated with solder.

For example, specific dimensions of the respective components in the first embodiment are shown below. The surface electrode tab 104 has a width of 2 mm and a thickness of 0.2 mm, and the rear-surface electrode tab 105 has a width of 3 mm and a thickness of 0.13 mm. The thickness of the solder coating on these electrode tabs 104 and 105 is set to 0.03 mm. A length of the tab-to-tab joined portion 107 is 7 mm, the gap 108 is 1 mm, and a length δ from an end face of the solar cell 1 to an end face of the rear-surface electrode tab 105 is 3 mm.

Moreover, as clearly found by the aforementioned analyses by reference to FIGS. 9, 10A and 10B, the gap 108 (hereinafter, indicated as "X") is desirably set within a range indicated by the following equation (1):

$$2T1 < X < 5(T1+T2) \tag{1}$$

wherein T1 represents the thickness of the surface electrode tab 104 and T2 represents the thickness of the rear-surface electrode tab 105.

By setting the value of gap 108 (X) within the range of the equation (1), it becomes possible to make a thermal stress on the non-light-receiving face 3 of the solar cell 1 caused by the surface electrode tab 104 smaller, and consequently to prevent cracking of the cells.

Figure 1D:
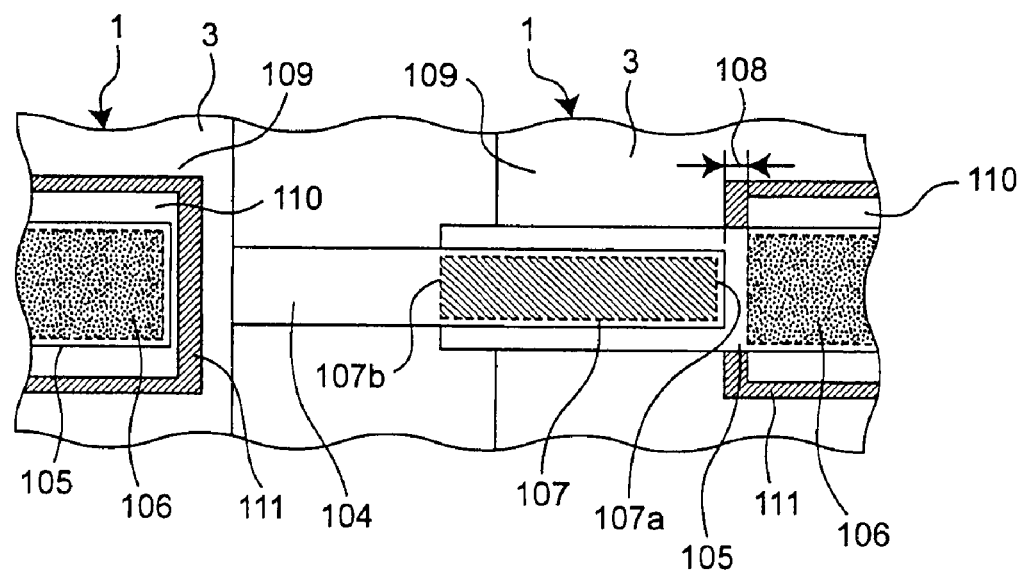
FIG. 1D is a plan view that shows another example of the connected state of solar cells shown in FIG. 1A.

Moreover, as shown in FIG. 1D, the other end portion 107b of the tab-to-tab joined portion 107 that is opposed to one end portion 107a of the tab-to-tab joined portion 107 may be placed outside the non-light-receiving face 3. That is, the rear-surface electrode tab 105 may be allowed to protrude from the non-light-receiving face 3. In this structure also, the gap 108 is preferably set within the range represented by the aforementioned equation (1).

Additionally, as shown in FIG. 1B, by disposing the rear-surface electrode tabs 105 with the above-mentioned distance δ placed so as to include the other end portion 107b within the region of the non-light-receiving face 3, no joined portion is located between the adjacent solar cells 1, so that it becomes possible to improve the outside appearance.

Moreover, as shown in the present embodiment, in the case when the collector electrode 109 is made from aluminum paste, and the tab-to-tab joined portion 107 between the surface electrode tab 104 and the rear-surface electrode tab 105 is joined with solder, by allowing the tab-to-tab joined portion 107 to be included within the region of the collector electrode 109, no solder is joined to the collector electrode 109. Thus, in the tab-to-tab joined portion 107, there is advantageous in that no installation of an adhesion preventive mask or the like is required upon carrying out a soldering process.

Furthermore, in the first embodiment, the above-mentioned distance δ is obtained based upon the following equation (2). That is, upon forming the tab-to-tab joined portion 107 between the surface electrode tab 104 and the rear-surface electrode tab 105, the solder may tend to stick out to adhere to the end portion of the solar cell 1 so as to cause a short circuit between the light-receiving face 2 and the non-light-receiving face 3. Therefore, calculations are carried out so that, even in the case when all the solder of the tab-to-tab joined portion 107 sticks out, a surface tension between the surface electrode tab 104 and the solar cell 1 becomes higher than a surface tension onto the end portion of the solar cell 1.

Figure 2A:
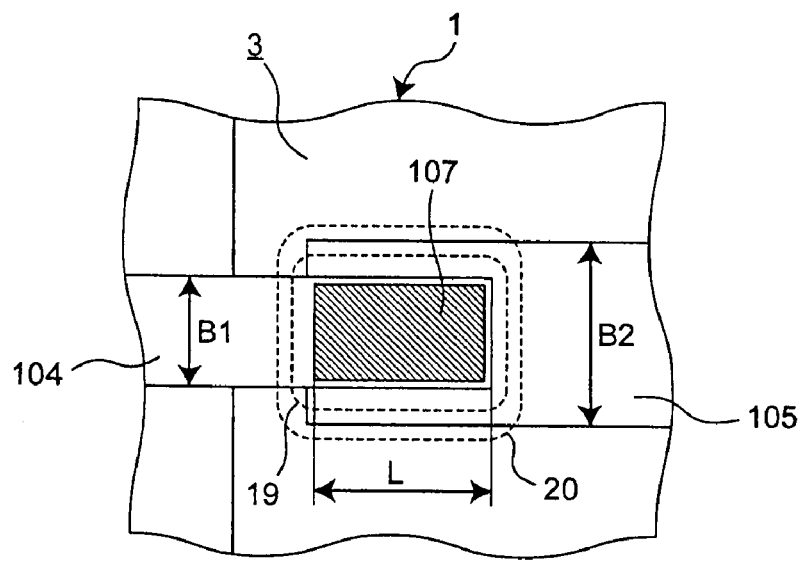
FIG. 2A is a plan view of a joined portion that explains sticking-out solder from the joined portion in the solar cell shown in FIG. 1A.
Figure 2B:
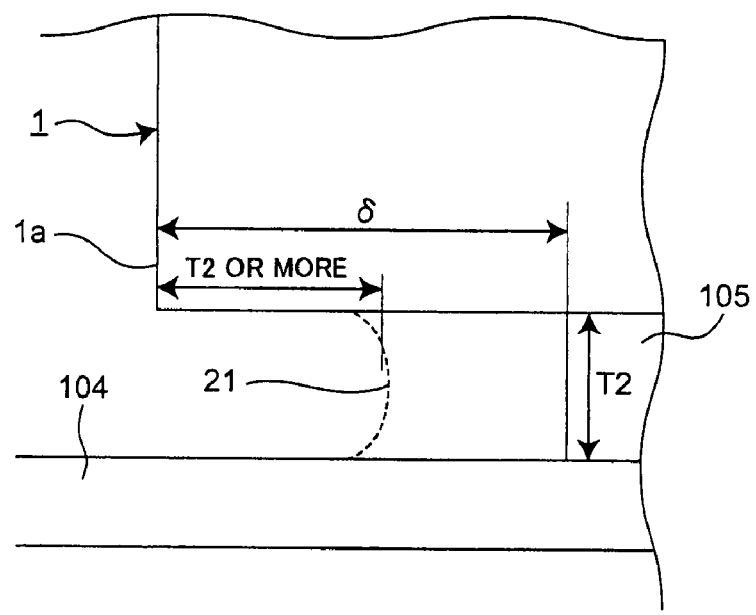
FIG. 2B is a side view of the joined portion that explains sticking-out solder from the joined portion in the solar cell shown in FIG. 1A.

FIGS. 2A and 2B show the concept of the above-mentioned calculations. In FIG. 2A, reference numeral 19 indicates the shape of a sticking-out solder caused by the connection between the surface electrode tab 104 and the rear-surface electrode tab 105, and reference numeral 20 indicates the shape of a sticking-out solder caused by the connection between the rear-surface electrode tab 105 and the solar cell 1. In FIG. 2B, reference numeral 21 represents the sticking-out solder portion.

Supposing that a thickness of the solder coating of the surface electrode tab 104 is Ts (not shown), a length of the tab-to-tab joined portion 107 is L, a width of the surface electrode tab 104 is B1, a width of the rear-surface electrode tab 105 is B2 and a thickness of the rear-surface electrode tab 105 is T2, the amount of the sticking-out solder to the end portion 1a of the solar cell 1 caused by the connection of the surface electrode tab 104 and the rear-surface electrode tab 105 is indicated by the following equation:

$$Ts \times (L \times B1) \times B1 \times 2/2(B1+L).$$

The amount of the sticking-out solder to the end portion 1a of the solar cell 1 from the rear-surface electrode tab 105 with respect to the light-receiving face 2 of the solar cell 1 is indicated by the following equation:

$$Ts \times (L \times B2) \times B2/2(B2+L).$$

A value obtained by dividing the total of the amounts of sticking-out solder by B1×T2 represents a length of the sticking-out solder, supposing that the cross-sectional shape thereof has a rectangular shape. In order to keep the cross-sectional shape as the rectangular shape, based on the surface tension, an end of the sticking-out solder 21 needs to be larger than the thickness T2 of the rear-surface electrode tab 105 from the end portion 1a of the solar cell 1. Therefore, the distance δ from the end portion 1a is indicated by the following equation (2):

[Equation 1]

$$\delta > \frac{Ts \times L}{B1 \times T2}\left(\frac{2 \times B1^2}{2(B1+L)} + \frac{B2^2}{2(B2+L)}\right) + T2 \quad (2)$$

In the first embodiment, the distance δ from the end portion 1a of the solar cell 1 is desirably set to 0.9 mm or more. More preferably the distance δ is set to 2 mm or more by taking manufacturing deviations into consideration. In contrast, in the case when the distance δ becomes ½ or more of the length of the solar cell 1 in the array direction, an electric resistance from the non-light-receiving face 3 to the light-receiving face 2 of the solar cell 1 increases; therefore, the distance δ is preferably set to less than ½ of the length of the solar cell 1 in the array direction.

Figure 1E:
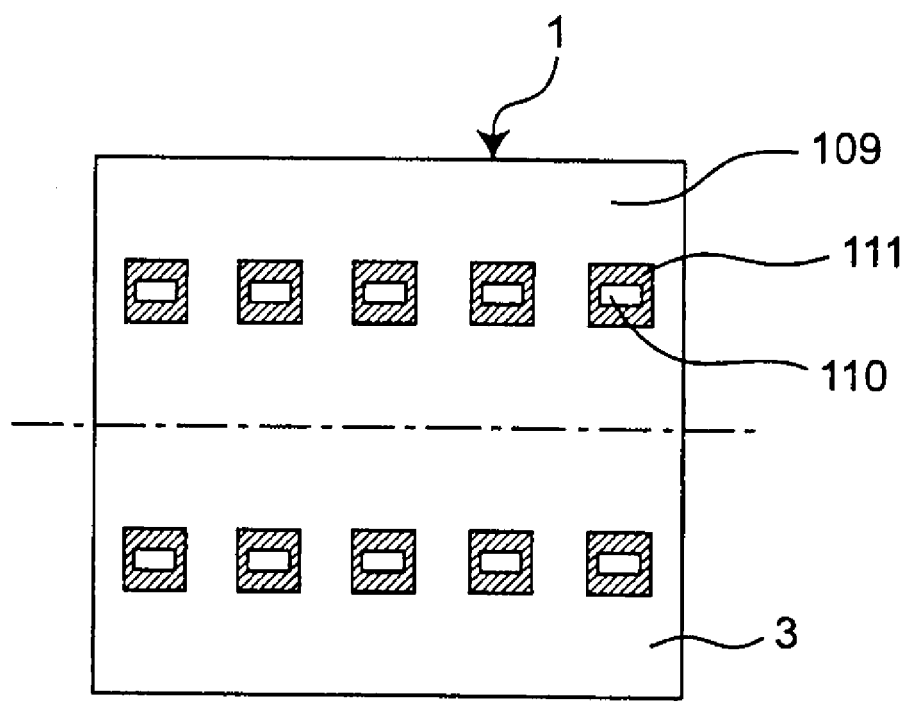
FIG. 1E is a view that shows a layout of collector electrodes and tab-use electrodes that are formed on the non-light-receiving face of the solar cell shown in FIG. 1A.

Moreover, the effects of the first embodiment are not dependent on the layout shape of the tab-to-cell joined portion 106 between the rear-face electrode tab 105 and the solar cell 1. That is, in the present embodiment, as shown in FIG. 10, the tab-use electrode 110 to which the rear-surface electrode tab 105 is connected through the tab-to-cell joined portion 106 is continuously extended linearly; however, the tab-use electrode 110 may be designed so that, as shown in FIG. 1E, portions thereof are discontinuously disposed at intervals.

As described above, in accordance with the solar battery panel in the first embodiment of the present invention, the tab-to-tab joined portion and the tab-to-cell joined portion are disposed with the gap interposed therebetween, and one of end portions of the tab-to-tab joined portion is located within the non-light-receiving region of the solar cell. In accordance with this structure, since the tab-to-tab joined portion and the tab-to-cell joined portion are positioned in a deviated manner in the array direction of the solar cell; therefore, even in the case when a load is exerted on the solar cell upon connecting the surface electrode tab and the rear-surface electrode tab to each other, it is possible to reduce damages to the solar cell. Moreover, since one of the end portions of the tab-to-tab joined portion is located within the non-light-receiving region of the solar cell, the gap between the solar cells can be narrowed. Thus, it is possible to obtain a solar battery panel that can reduce cracking of the solar cell, without causing a reduction in the amount of power generation per unit area of the solar battery panel. Moreover, it is also possible to miniaturize the solar battery panel.

In order to confirm the effects of the solar battery panel of the first embodiment, the following strength test is carried out. With respect to a solar battery panel having a conventional structure and the solar battery panel of the first embodiment, strength test samples are respectively prepared, and the respective breaking strengths are compared.

The dimensions of the respective components of the solar battery panel in the first embodiment for use as strength test samples are explained as follows. The surface electrode tab 104 has a width of 2 mm and a thickness of 0.2 mm, and the rear-surface electrode tab 105 has a width of 3 mm and a thickness of 0.13 mm. A thickness of the solder coating on these electrode tabs 104 and 105 is set to 0.03 mm. A length of the tab-to-tab joined portion 107 is 7 mm, the gap 108 is 1 mm, and the distance δ from the end face of the solar cell 1 to the end face of the rear-surface electrode tab 105 is 1 mm.

Additionally, as described earlier, the distance δ is more preferably set to 2 mm or more by taking manufacturing deviations into consideration; however, this is set to 1 mm in the present tests because no evaluation is made on electrical characteristics.

In the solar battery panel in the conventional structure, the dimensions of the rear-surface electrode tab 5 and the surface electrode tab 4 are same as those of the surface electrode tab 104 and the rear-surface electrode tab 105 of the first embodiment, with a length of the tab-to-tab joined portion 7 being set to 5 mm.

Figure 3A:
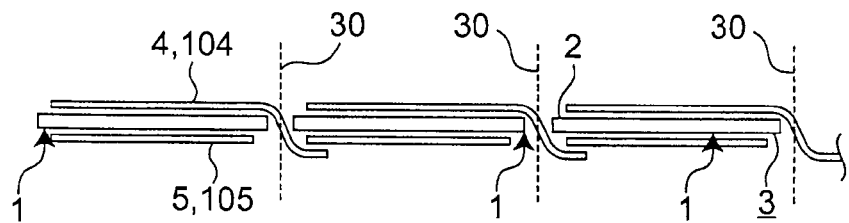
FIG. 3A is a drawing that explains a manufacturing method for a strength test sample for solar cells having a conventional structure and the solar cells of the first embodiment.
Figure 3B:
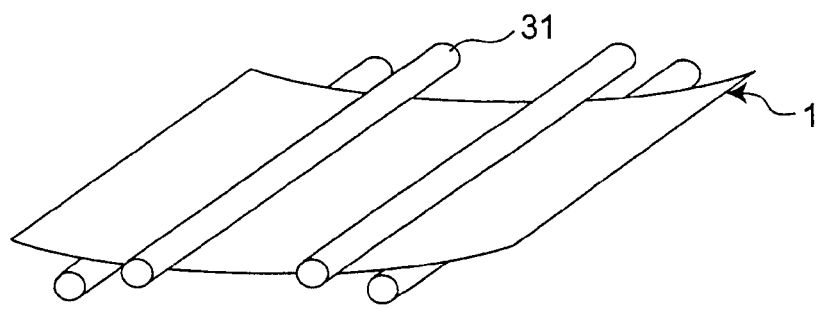
FIG. 3B is a perspective view that explains a testing method for evaluating the breaking strength of the strength test sample shown in FIG. 3A.

As shown in FIG. 3A, the respective strength test samples of the prior art and the first embodiment are manufactured in the following manner: First, a member is prepared by series-connecting the respective solar cells 1 to one after another, and the tab is cut off between the respective cells through a cutting portion 30 indicated by a dotted line so that a sample member having one sheet of cell to which a tab is joined is manufactured. Each of the strength test samples thus manufactured is subjected to a four-point bending test by the use of a pressing jig 31, as shown in FIG. 3B; thus, the breaking strength is measured.

Since the solar cells used for manufacturing the strength test samples are equivalent to each other, it is assumed that the difference in breaking strengths is derived from a difference in residual stresses due to soldering, generated in the solar cells.

Figure 3C:
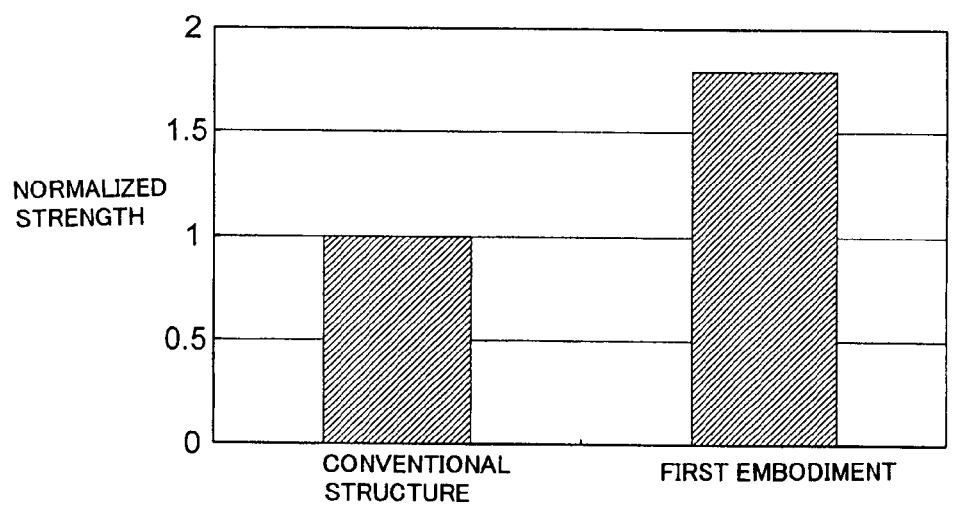
FIG. 3C is a graph that shows the comparison results of breaking strength of the strength test sample shown in FIG. 3A.

FIG. 3C shows the results of the breaking strength tests. The number of the samples in the first embodiment is 15, the number of the samples of the conventional structure is 7, and the average values are shown. The numeric values are normalized by the average value of those of conventional structure. As clearly indicated by FIG. 3C, the breaking strength in the samples of the first embodiment is improved in comparison with the breaking strength of the samples of the conventional structure. Therefore, it is possible to confirm that, by disposing the tab-to-tab joined portion 107 between the surface electrode tab 104 and the rear-surface electrode tab 105 with a predetermined gap relative to the tab-to-cell joined portion 106 between the rear-surface electrode tab 105 and the solar cell 1, so that a thermal stress to be generated in the solar cell 1 can be reduced.

Therefore, in accordance with the structure of first embodiment, it is possible to obtain a solar battery panel that can reduce occurrence of cracking in the solar cells 1 without the necessity of widening the gap between the cells, and consequently to improve the reliability during the actual use of the solar battery panel. Thus, it becomes possible to provide a solar battery panel having a small size and a prolonged service life.

Second Embodiment

Figure 4A:
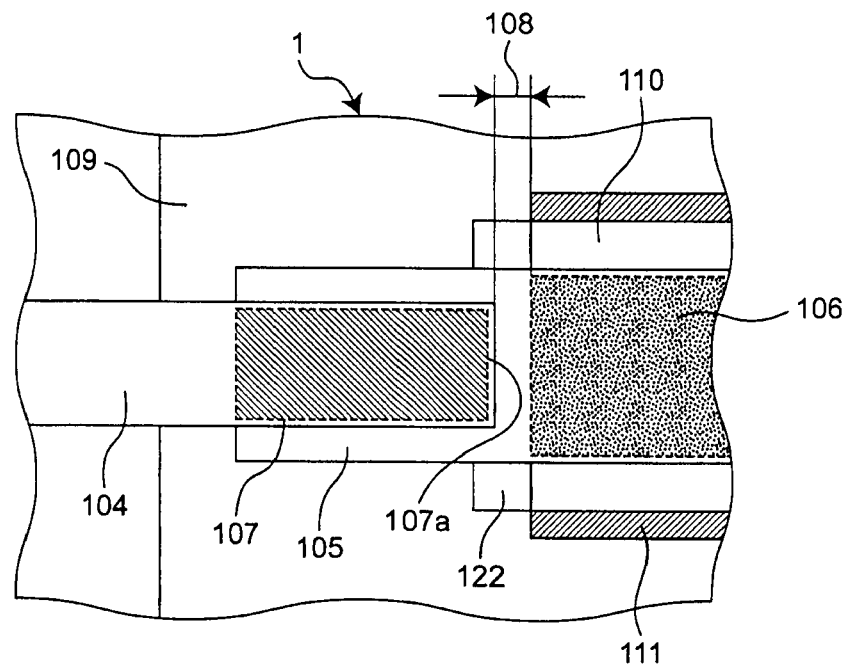
FIG. 4A is a plan view that shows a joined portion between the solar cell and the electrode tab in accordance with a second embodiment of the present invention.
Figure 4B:
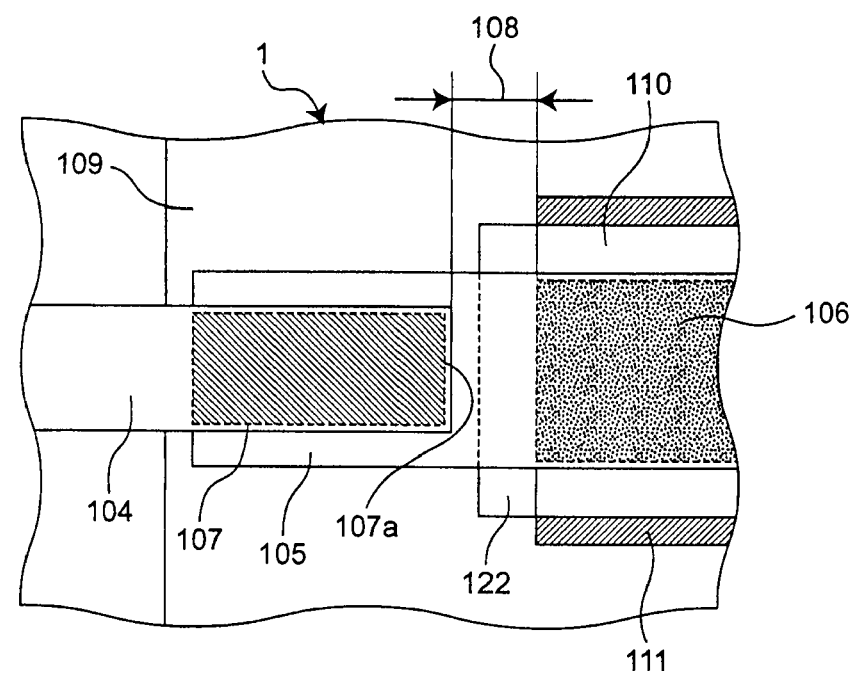
FIG. 4B is a plan view that shows another example of the joined portion shown in FIG. 4A.

FIGS. 4A and 4B show a joined portion between the non-light-receiving face 3 and the rear-surface electrode tab 105 in accordance with a second embodiment of the present invention. Although the shape of the rear-surface electrode tab 105 is the same as that of the first embodiment, the pattern shapes of the collector electrode 109 made by aluminum paste on the light-receiving face 3 and the tab-use electrode 110 for use in soldering with silver paste are different from those of the first embodiment.

On the collector electrode 109 and the tab-use electrode 110, an alloy portion 111 of aluminum and silver, which is a portion to be overlapped so as to obtain electricity, is formed. However, the alloy portion 111 has been known as a fragile portion to cause a starting point of cell cracking (for example, JP-A No. 2003-273378). Conventionally, on the joined portion between the non-light-receiving face 3 and the rear-surface electrode tab 5, a uniform stress has been generated on the entire circumference of the joined portion; however, in the embodiment of the present invention, a largest stress is generated between the tab-to-tab joined portion 107 and the tab-to-cell joined portion 106.

For this reason, in the second embodiment, in association with the gap 108 between the tab-to-tab joined portion 107 and the tab-to-cell joined portion 106 that cause a large thermal stress, a non-electrode formation region 122 on which none of the electrodes 109 and 110 made from the aluminum paste and silver paste are formed is prepared on the non-light-receiving face 3 of the solar cell 1. In accordance with this structure, no alloy portion 111 that is fragile is formed on the non-light-receiving face 3 corresponding to the gap 108 that generates a large thermal stress. As a result, the strength of the solar cell 1 at the portion generating a high stress can be improved. Therefore, the yield of the solar battery panel is improved, and the reliability during the actual use is also improved. Moreover, the service life of the solar battery panel can be prolonged.

In the second embodiment, the non-electrode formation region 122 is in a state in which the silicon of the solar cell 1, as it is, is exposed to the non-light-receiving face 3; however, a material other than aluminum and silver, for example, $SiO_2$ or the like, may be formed on the non-light-receiving face 3.

Moreover, in the structure shown in FIG. 4A, one of the end portions 107a of the tab-to-tab joined portion 107 is positioned above the non-electrode formation region 122; however, as shown in FIG. 4B, the one end portion 107a may be position at a place apart from above the non-electrode formation region 122.

Third Embodiment

Figure 5A:
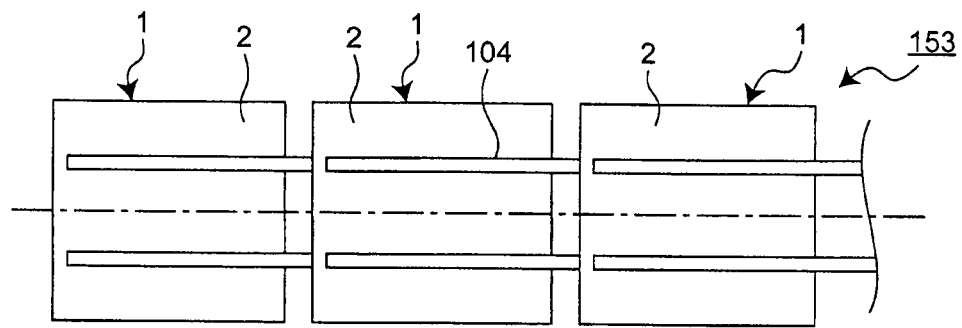
FIG. 5A is a view that shows a connected state of solar cells provided in a solar battery panel in accordance with a third embodiment of the present invention.
Figure 5B:
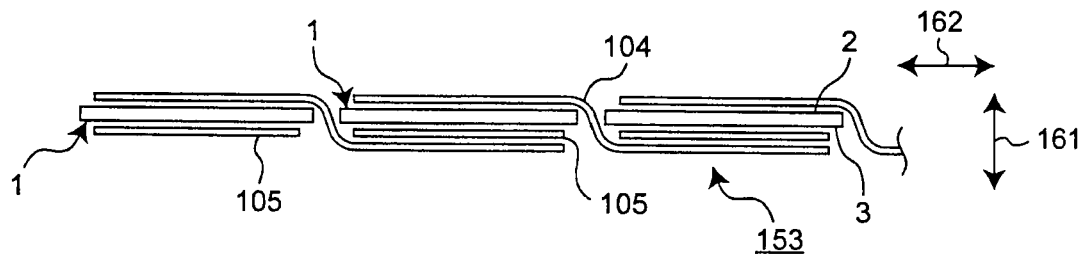
FIG. 5B is a side view that shows a connected state of the solar cell shown in FIG. 5A.
Figure 5C:
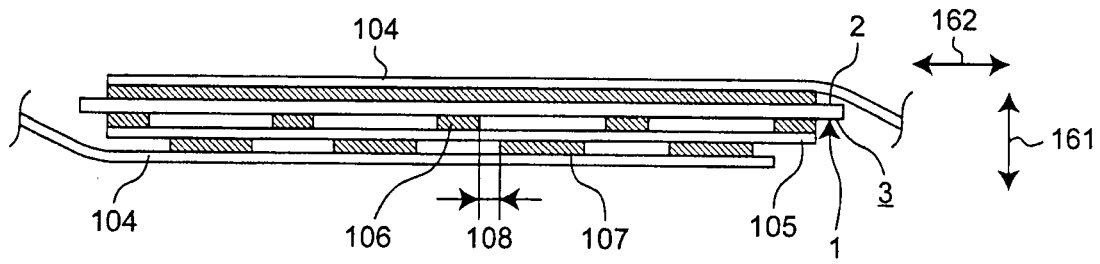
FIG. 5C is a side view that shows a connected state of electrode tabs in one solar cell shown in FIG. 5A.

FIGS. 5A to 5D show a series connected state of solar cells of a solar battery panel 153 in accordance with a third embodiment of the present invention. In FIGS. 5B and 5C, the aforementioned collector electrode 109 and the tub-use electrode 110, formed on the non-light-receiving face 3, are omitted from the drawings.

Figure 5D:
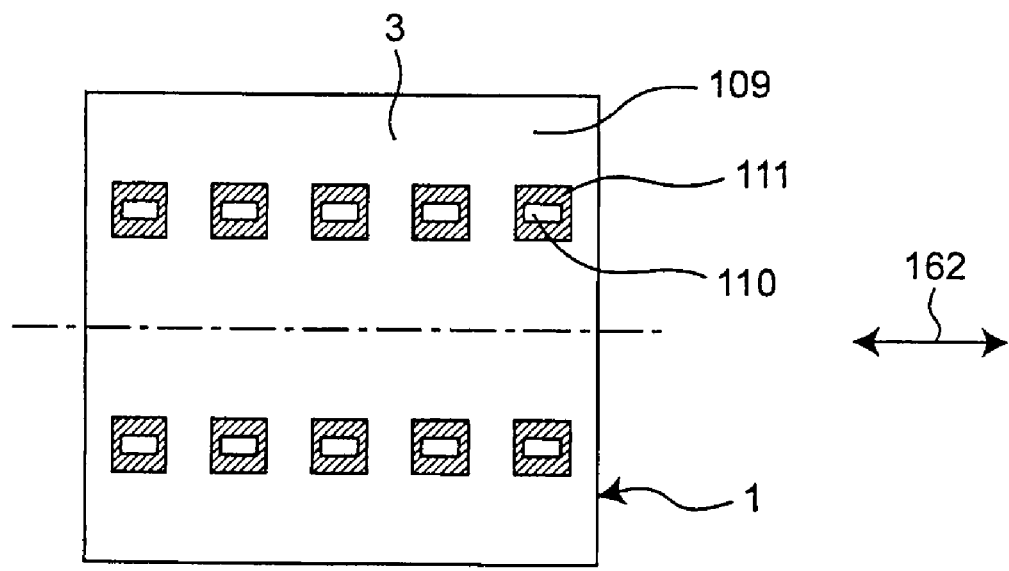
FIG. 5D is a plan view that shows a layout of collector electrodes and tab-use electrodes that are formed on the non-light-receiving face of the solar cell shown in FIG. 5A.

In the third embodiment, as shown in FIGS. 5B and 5C, on the non-light-receiving face 3 of the solar cell 1, the surface electrode tab 104 is extended over substantially the entire length of the non-light-receiving face 3 along the array direction 162. The third embodiment differs from the first and second embodiments in this point. In the present embodiment, as shown in FIG. 5D, the tab-use electrode 110 is formed in such a manner that portions thereof are discontinuously formed along the array direction 162 every predetermined gap. Therefore, as shown in FIG. 5C, the tab-use electrode 110, that is, the tab-to-cell joined portion 106 between the solar cell 1 and the rear-surface electrode tab 105 is also discontinuously formed every predetermined gap in the array direction 162. Moreover, the tab-to-tab joined portion 107 between the rear-surface electrode tab 105 and the surface electrode tab 104 is also formed along the array direction 162 every predetermined gap. Of course, in the present embodiment also, the tab-to-tab joined portions 107 are disposed with the gaps 108, relative to the tab-to-cell joined portions 106, as described earlier. Therefore, the tab-to-cell joined portions 106, the gaps 108, and the tab-to-tab joined portions 107 are alternately disposed along the array direction 162. Moreover, in the array direction 162, the rear-surface tab 105 is not allowed to protrude outside from the region of the non-light-receiving face 3.

In this manner, in the solar battery panel 153 having series-connected solar cells 1, since a conduction resistance between the electrode tabs 104 and 105 disposed on the non-light-receiving face 3 side is made substantially equal to a conduction resistance obtained in the case when the surface electrode tab 104 and the rear-surface electrode tab 105 are connected in parallel with each other, the conduction resistance is lowered to a great degree. Therefore, since the conduction resistance loss is lowered, the power generating efficiency of the solar battery panel 153 is improved.

In the conventional solar battery panel structure, in order to make the conduction resistance loss of the electrode tab equivalent to that of the present embodiment, a method may be proposed in which the thickness of the electrode tabs 4 and 5 is made thicker; however, in the case when this method is adopted, a thermal stress in the joined portion between the solar cell 1 and the rear-surface electrode tab 5 is increased, with the result that the possibility of occurrence of cell cracking becomes higher.

In contrast, in the third embodiment, the generation of a thermal stress can be suppressed to the same level as that derived from the single substance of the rear-surface electrode tab 105 to be joined to the solar cell 1. Therefore, the power generating efficiency of the solar battery panel 153 can be improved without an increase in the generation of cracking in the solar cell 1. Additionally, the value of the gap 108 is desirably set within the range of equation (1) as explained in the first embodiment. However, with respect to a plurality of existing gaps 108, it is not necessary to set all the gaps 108 to the same value.

Fourth Embodiment

Figure 6A:
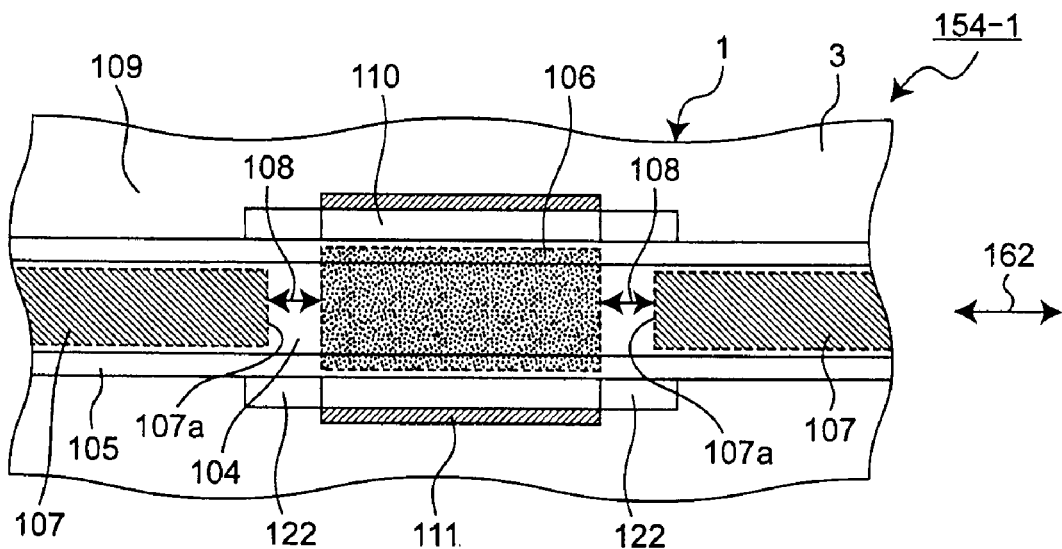
FIG. 6A is a plan view that shows a joined portion between a solar cell and an electrode tab installed in the solar battery panel in accordance with a fourth embodiment of the present invention.
Figure 6B:
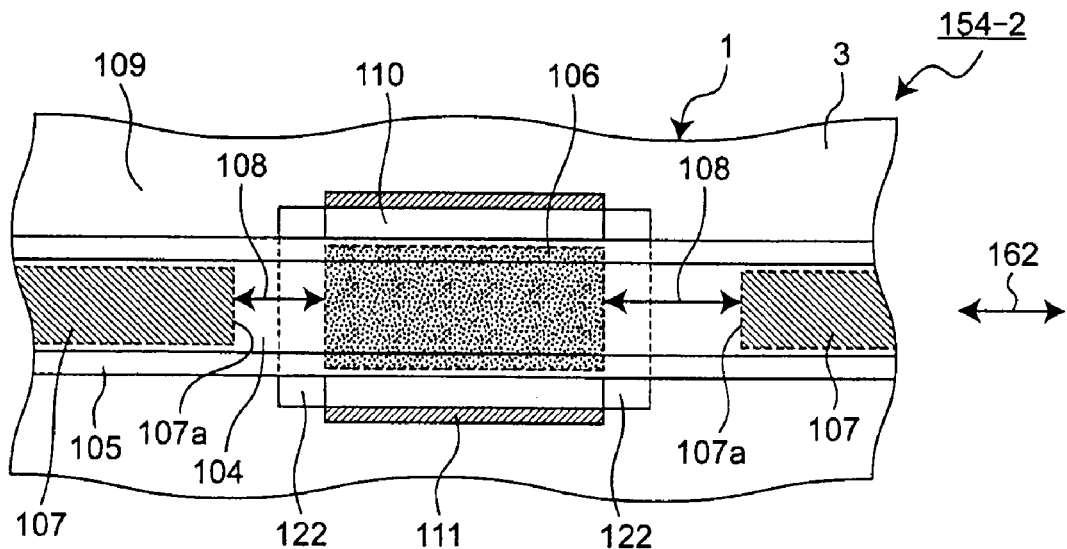
FIG. 6B is a plan view that shows another example of the joined portion shown in FIG. 6A.

FIGS. 6A and 6B show solar battery panels 154-1 and 154-2 in accordance with a fourth embodiment of the present invention. The structure of the fourth embodiment corresponds to a structure formed by combining the second and third embodiments. That is, on the non-light-receiving face 3 of the solar cell 1, the surface electrode tab 104 is extended over substantially the entire length of the non-light-receiving face 3 along the array direction 162, and the tab-to-cell joined portions 106, the gaps 108 and the tab-to-tab joined portions 107 are disposed alternately along the array direction 162, with the non-electrode formation region 122 being formed on the non-light-receiving face 3. As described earlier, since the tab-to-cell joined portions 106, the gaps 108 and the tab-to-tab joined portions 107 are alternately arranged, the non-electrode formation regions 122 are also arranged at respective positions corresponding to the gaps 108, as shown in FIGS. 6A and 6B. Additionally, since the explanation as to the non-electrode formation regions 122 is the same as that given in the second embodiment, the corresponding explanation will be omitted.

FIG. 6A shows the solar battery panel 154-1 having a structure in which one of the end portions 107a on the tab-to-cell joined portion 106 side in the tab-to-tab joined portion 107 is positioned above the non-electrode formation area 122. Moreover, FIG. 6B shows the solar battery panel 154-2 having a structure in which the one end portion 107a is positioned apart from above the non-electrode formation area 122.

The solar battery panels 154-1 and 154-2 of the fourth embodiment having these structures are allowed to have both of the effects of the solar battery panels in accordance with the second and third embodiments.

Additionally, among the above-mentioned various embodiments, by combining optional embodiments with one another on demand, it is possible to obtain the respective effects thereof.

Although the present invention has been fully described in connection with preferred embodiments with reference to the accompanying drawings, it is to be understood that various changes and modifications will be apparent to those skilled in the art. Such changes and modifications are to be understood as included within the scope of the present invention as defined by the appended claims unless they depart therefrom.

Moreover, all the contents of disclosure including the specification, drawings, claims and abstract of Japanese patent application No. 2007-207380, filed on Aug. 9, 2007, are incorporated herein by reference.

INDUSTRIAL APPLICABILITY

The present invention is applicable to a solar battery panel having a structure in which a plurality of solar cells are connected to one another by using electrode tabs.

The invention claimed is:

1. A solar battery panel comprising:
a plurality of solar cells;
a surface electrode tab configured to be connected to a light-receiving face of each of the solar cells; and
a rear-surface electrode tab configured to be connected to a non-light-receiving face of each of the solar cells, the surface electrode tab of one of said solar cells being connected to the rear-surface electrode tab of an adjacent solar cell, so that the plurality of the solar cells are series-connected to one after another,
wherein, a tab-to-tab joined portion connecting the surface electrode tab of the one of said solar cells to the rear-surface electrode tab of the adjacent solar cell is disposed in an array direction of the solar cells so as not to be overlapped with respect to a tab-to-cell joined portion between the rear-surface electrode tab of the adjacent solar cell and the adjacent solar cell in a thickness direction of the solar cells, such that a gap in the array direction is present between the tab-to-cell joined portion of the adjacent solar cell and one end portion of the tab-to-tab joined portion that is closest to the tab-to-cell joined portion of the adjacent solar cell, and
the one end portion of the tab-to-tab joined portion is located within a region of the non-light-receiving face,
wherein, where T1 represents a thickness of the surface electrode tab, T2 represents a thickness of the rear-surface electrode tab, and X represents the gap between any portion of the tab-to-cell joined portion and the one end portion of the tab-to-tab joined portion that is closest to the tab-to-cell joined portion, the gap X is set within a range indicated by the following equation:

$$2 \cdot T1 < X < 5 \cdot (T1 + T2).$$

2. The solar battery panel according to claim 1, wherein the other end portion of the tab-to-tab joined portion opposing to the one end portion in the array direction is also located within the region of the non-light-receiving face.

3. The solar battery panel according to claim 2, further comprising:
a collector electrode configured to be formed on the non-light-receiving face by using aluminum paste,
wherein the surface electrode tab and the rear-surface electrode tab are soldered, and the tab-to-tab joined portion is disposed within a region of the collector electrode.

4. The solar battery panel according to claim 3, further comprising:
- a tab-use electrode configured to be formed on the non-light-receiving face by using silver paste and to be connected to the rear-face electrode tab through the tab-to-cell joined portion; and
- a non-electrode formation region configured to be formed on the non-light-receiving face with opposing to the gap and configured so that neither the collector electrode nor the tab-use electrode is located thereon.

5. The solar battery panel according to claim 1, wherein one solar cell has a plurality of the tab-to-tab joined portions and tab-to-cell joined portions on the non-light-receiving face thereof, with the tab-to-tab joined portions and the tab-to-cell joined portions being alternately disposed in the array direction of the solar cells.

* * * * *